United States Patent
Ha et al.

(10) Patent No.: US 10,656,211 B2
(45) Date of Patent: May 19, 2020

(54) METHOD OF PREDICTING TIME FOR CHARGING BATTERY OF ECO-FRIENDLY VEHICLE

(71) Applicants: Hyundai Motor Company, Seoul (KR); Kia Motors Corporation, Seoul (KR)

(72) Inventors: Dong Gil Ha, Gyeonggi-do (KR); Woo Sung Kim, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 180 days.

(21) Appl. No.: 16/017,266

(22) Filed: Jun. 25, 2018

(65) Prior Publication Data
US 2019/0212392 A1    Jul. 11, 2019

(30) Foreign Application Priority Data

Jan. 5, 2018    (KR) .......................... 10-2018-0001896

(51) Int. Cl.
*B60L 53/00*    (2019.01)
*G01R 31/367*    (2019.01)
*H02J 7/00*    (2006.01)
*B60L 58/12*    (2019.01)

(52) U.S. Cl.
CPC ............ *G01R 31/367* (2019.01); *B60L 53/00* (2019.02); *B60L 58/12* (2019.02); *H02J 7/007* (2013.01); *H02J 7/0047* (2013.01)

(58) Field of Classification Search
CPC ...................................................... B60L 53/00
USPC ........................................................... 320/109
See application file for complete search history.

(56) References Cited

U.S. PATENT DOCUMENTS

| | | | | |
|---|---|---|---|---|
| 5,565,759 A | * | 10/1996 | Dunstan | H02J 7/00036 320/135 |
| 2009/0153104 A1 | * | 6/2009 | Matsuura | H02J 7/0091 320/153 |
| 2013/0002190 A1 | * | 1/2013 | Ogura | H01M 10/44 320/101 |
| 2014/0354289 A1 | * | 12/2014 | Kim | B60L 11/1861 324/426 |

FOREIGN PATENT DOCUMENTS

KR    20150074436 A    7/2015

\* cited by examiner

*Primary Examiner* — Jerry D Robbins
(74) *Attorney, Agent, or Firm* — Mintz Levin Cohn Ferris Glovsky and Popeo, P.C.; Peter F. Corless

(57) ABSTRACT

A method of predicting time for charging a battery of an eco-friendly vehicle can include: measuring a temperature and a voltage of the battery using one or more sensors; comparing the measured temperature and voltage with prestored data values; identifying a charging step among a plurality of charging steps; calculating a charging current value and a cutoff voltage value according to the identified charging step; and calculating an expected charging time by adding a second time to the expected charging time when a first time is greater than the second time or by adding the first time to the expected charging time when the second time is greater than the first time.

11 Claims, 3 Drawing Sheets

【FIG. 1】
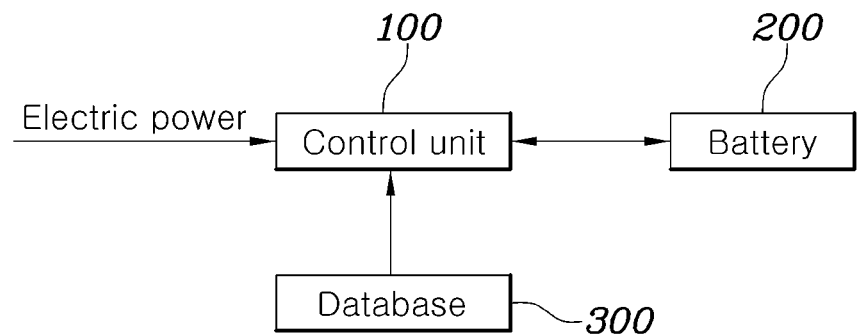

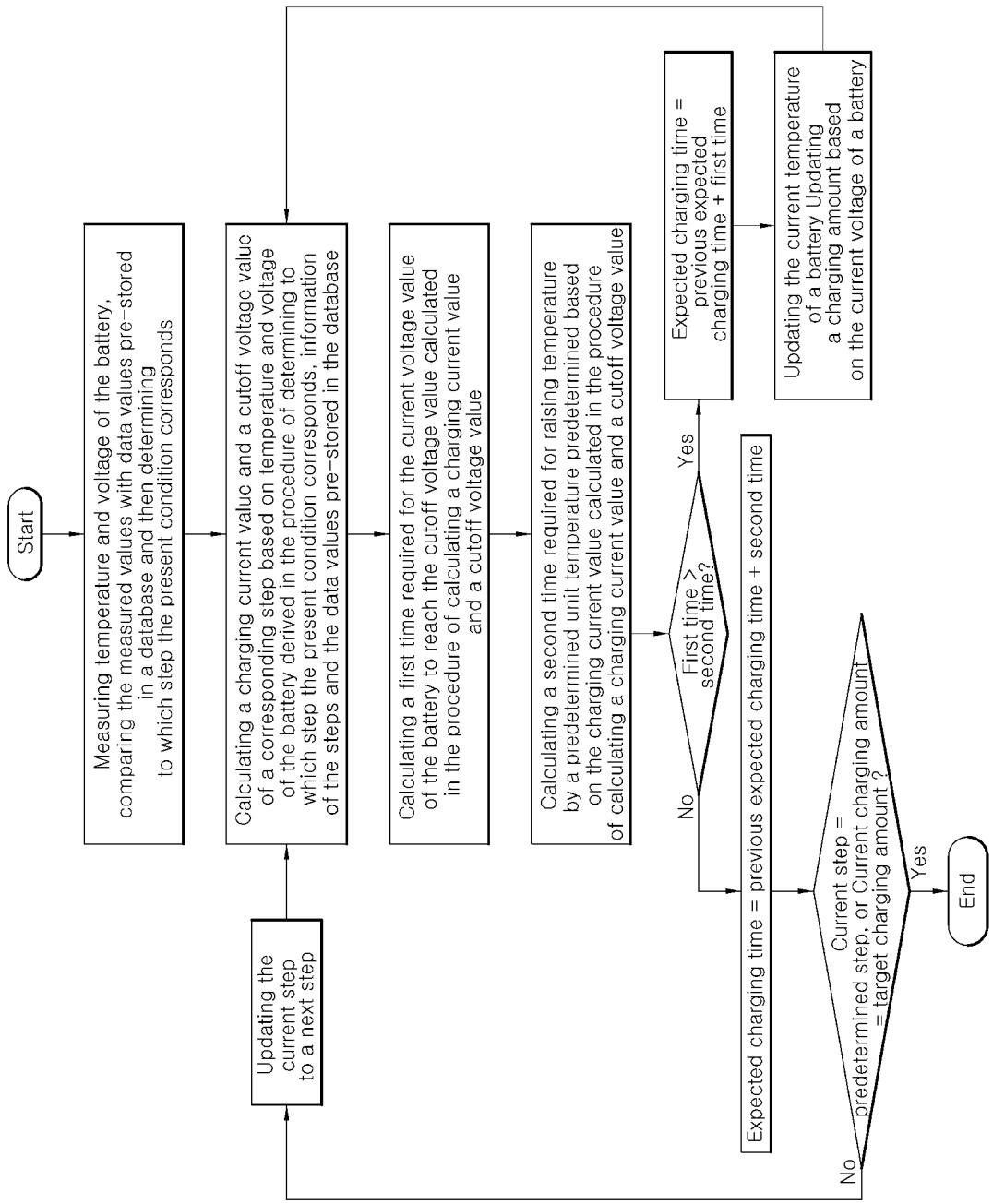
[ FIG. 2 ]

[FIG. 3]

| Current temperature | -35℃~ -10.1℃ | | -10℃~ 4.9℃ | | 5℃~ 9.9℃ | | 10℃~ 14.9℃ | | 15℃~ 19.9℃ | | 20℃~ 24.9℃ | | 25℃~ 34.9℃ | | 35℃~ 44.9℃ | | 45℃~ 49.9℃ | | 50℃~ 60℃ | |
|---|---|---|---|---|---|---|---|---|---|---|---|---|---|---|---|---|---|---|---|---|
| Step | Charging voltage | Cutoff current | Charging voltage | Cutoff current | Charging voltage | Cutoff current | Charging voltage | Cutoff current | Charging voltage | Cutoff current | Charging voltage | Cutoff current | Charging voltage | Cutoff current | Charging voltage | Cutoff current | Charging voltage | Cutoff current | Charging voltage | Cutoff current |
| 1 | --- | --- | --- | --- | --- | --- | --- | --- | --- | --- | A | a | A' | a' | --- | --- | --- | --- | --- | --- |
| 2 | --- | --- | --- | --- | --- | --- | --- | --- | --- | --- | B | b | B' | b' | --- | --- | --- | --- | --- | --- |
| 3 | --- | --- | --- | --- | --- | --- | --- | --- | --- | --- | C | c | C' | c' | --- | --- | --- | --- | --- | --- |
| 4 | --- | --- | --- | --- | --- | --- | --- | --- | --- | --- | D | d | D' | d' | --- | --- | --- | --- | --- | --- |
| 5 | --- | --- | --- | --- | --- | --- | --- | --- | --- | --- | E | e | E' | e' | --- | --- | --- | --- | --- | --- |
| 6 | --- | --- | --- | --- | --- | --- | --- | --- | --- | --- | F | f | F' | f' | --- | --- | --- | --- | --- | --- |
| 7 | --- | --- | --- | --- | --- | --- | --- | --- | --- | --- | G | g | G' | g' | --- | --- | --- | --- | --- | --- |

METHOD OF PREDICTING TIME FOR CHARGING BATTERY OF ECO-FRIENDLY VEHICLE

CROSS-REFERENCE TO RELATED APPLICATION

The present application claims the benefit of priority to Korean Patent Application No. 10-2018-0001896, filed on Jan. 5, 2018, the entire contents of which are incorporated herein by reference.

BACKGROUND OF THE DISCLOSURE

Field of the Disclosure

The present disclosure relates to vehicular technologies and, more particularly, to a method of predicting time for charging a battery of an eco-friendly vehicle.

Description of the Related Art

Recently, as the demand for environmentally friendly, or "eco-friendly," vehicles has increased, research and development directed toward electric vehicles has also increased. One of the most important considerations relating to vehicles capable of being driven by electric energy is the traveling distance.

Typically, the traveling distance of electric vehicles depends on a capacity of a battery (e.g., a high-voltage battery). Thus, in order to increase the traveling distance, attempts to increase capacity and energy density of the battery itself have been made. Also, a water cooling system and a system for raising temperature have been employed to prevent deterioration of the battery due to temperature.

However, the time for charging a battery increases as the energy of the battery increases. In the case of a long-distance electric vehicle, a step-by-step charging method has been used, in which a charging current may be changed depending on temperature/voltage using an intrinsic characteristic of a battery, i.e., that the battery can be charged quickly in a low state of charge (SOC).

However, temperature and voltage of the battery may vary depending on the charging current, and even the temperature of the battery may vary depending on performance and control of the system for cooling/raising a temperature. Further, because a charging current may vary depending on the temperature/voltage of the battery, the charging current may change and influence the voltage of the battery. In other words, it has been difficult to estimate an expected charging time because the charging current abruptly changes in response to change of temperature and voltage during charge of the battery. In addition, there has been a difficulty in providing users with an accurate expected charging time because, depending on an initial charging amount and a target charging amount of the battery, there is a difference in the charging time between the two cases even if the charging amount in both cases is the same.

As the foregoing described as the background art is just to promote better understanding of the background of the present disclosure, it must not be taken as an admission that it corresponds to the related art well known to those who have ordinary skill in the art.

SUMMARY OF THE DISCLOSURE

The present disclosure has been made to solve the above-described problems. It is an object of the present disclosure to provide a method of predicting time for charging a battery of an eco-friendly vehicle that can further enhance convenience of charge by calculating a more accurate expected time for charging the battery.

According to embodiments of the present disclosure, a method of predicting time for charging a battery of an eco-friendly vehicle, in which the battery is charged by a charging process including plurality of charging steps sequentially divided based on a voltage of the battery for each temperature, a charging current corresponding to each of the plurality of charging steps, can include: measuring a temperature and a voltage of the battery using one or more sensors; comparing the measured temperature and voltage with data values pre-stored in a database including information relating to the plurality of charging steps; identifying a charging step among the plurality of charging steps based on the comparison of the measured temperature and voltage with the pre-stored data values; calculating a charging current value and a cutoff voltage value according to the identified charging step; calculating a first time required for the current voltage value of the battery to reach the cutoff voltage value; calculating a second time required for raising the measured temperature by a unit temperature predetermined based on the charging current value; comparing the first time with the second time; and calculating an expected charging time by adding the second time to the expected charging time when the first time is greater than the second time or by adding the first time to the expected charging time when the second time is greater than the first time.

The method may further comprise: after calculating the expected charging time by adding the second time to the expected charging time, updating the measured temperature of the battery and a charging amount based on the measured voltage of the battery.

The method may further comprise updating the charging process from the current charging step to a next charging step after calculating the expected charging time by adding the first time to the expected charging time.

The calculating of the charging current value and the cutoff voltage value may further comprise calculating the charging current value and the cutoff voltage of a corresponding charging step based on the updated temperature of the battery, the updated charging amount, and the data values pre-stored in the database.

The calculating of the charging current value and the cutoff voltage value may comprise calculating the charging current value and the cutoff voltage of a corresponding charging step based on then updated charging process and the data values pre-stored in the database.

The calculating a first time may comprise calculating the first time based on a charging amount calculated based on the measured voltage of the battery and the expected charging time.

The method may further determining whether the current charging step has reached a predetermined charging step after calculating the expected charging time by adding the first time to the expected charging time.

The method may further comprise determining whether a current charging amount has reached a target charging amount after calculating the expected charging time by adding the first time to the expected charging time.

The method may further comprise, when it is determined that the current charging step has reached the predetermined charging step, terminating the calculation of the expected charging time.

The method may further comprise, when it is determined that the current charging amount has reached the target charging amount, terminating the calculation of the expected charging time.

The calculating of the charging current value and the cutoff voltage value may comprise calculating the charging current value by comparing the maximum current value of a charger with the charging current value.

According to the present disclosure, a more accurate expected time for charging a battery can be calculated, thereby enhancing user convenience during the battery charging process.

BRIEF DESCRIPTION OF THE DRAWINGS

The embodiments herein may be better understood by referring to the following description in conjunction with the accompanying drawings, briefly described below, in which like reference numerals indicate identically or functionally similar elements.

FIG. 1 is a block diagram illustrating a charging system to which a method of predicting time for charging a battery of an eco-friendly vehicle according to embodiments of the present disclosure is applied.

FIG. 2 is a flow chart showing procedures in a method of predicting time for charging a battery of an eco-friendly vehicle according to embodiments of the present disclosure.

FIG. 3 is a table showing charging conditions depending on temperature and voltage of a battery for each charging step in a method of predicting time for charging a battery of an eco-friendly vehicle according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, embodiments of the present disclosure will be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one control unit. The term "control unit" may refer to a hardware device that includes a memory and a processor. The memory is configured to store program instructions, and the processor is specifically programmed to execute the program instructions to perform one or more processes which are described further below. The control unit may control operation of units, modules, parts, or the like, as described herein. Moreover, it is understood that the below methods may be executed by an apparatus comprising the control unit in conjunction with one or more other components, as would be appreciated by a person of ordinary skill in the art.

Furthermore, the control unit of the present disclosure may be embodied as non-transitory computer readable media containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed throughout a computer network so that the program instructions are stored and executed in a distributed fashion, e.g., by a telematics server or a Controller Area Network (CAN).

A method of predicting time for charging a battery of an eco-friendly vehicle according to various embodiments of the present disclosure will now be described in detail with reference to the accompanying drawings.

FIG. 1 is a block diagram illustrating a charging system to which a method of predicting time for charging a battery of an eco-friendly vehicle according to embodiments of the present disclosure is applied.

As shown in FIG. 1, the charging system to which a method of predicting time for charging a battery of an eco-friendly vehicle according to embodiments of the present disclosure is applied may comprise a control unit 100 for controlling a battery 200 and monitoring the status of the battery; the battery 200 for the vehicle; and a database 300.

The control unit 100 may be supplied with electric power and monitor the status of the battery 200 and control charge of the battery 200, as shown in FIG. 1. Here, the control unit 100 may be a battery management system (BMS) in some embodiments. More specifically, the control unit 100 may be supplied with electric power from a power supply unit (not shown). One or more sensors in communication with the control unit 100 can be used to measure and detect temperature and voltage of the battery, temperature and voltage of each cell, and the like. Furthermore, the control unit 100 may calculate an expected charging time of the battery by using information of the measured temperature and voltage of the battery and data values pre-stored in the database 300.

In addition, the control unit 100 may control a cooling fan, a system for raising temperature, or the like to maintain an optimal operating temperature of the battery and diagnose a failure of the battery through detection of overvoltage, overcurrent, overtemperature, or the like.

The battery 200 is installed in a hybrid vehicle or an electric vehicle and serves to supply electric power to a drive motor. The battery 200 may be a battery pack formed in a configuration of a pack by connecting cells in series according to a required capacity of the battery. Therefore, it should be appreciated that the battery as mentioned in the present disclosure and claims refers to all kind of batteries including a battery pack that can be used in a hybrid vehicle or an electric vehicle.

The database 300 serves to store data necessary for the control unit 100 to calculate the expected charging time of the battery. For example, as shown in FIG. 3, the database 300 may store information of charging currents depending on temperature and voltage of the battery in a plurality of charging steps, information of time required for raising temperature of the battery by a unit temperature predetermined on the basis of each charging current value in various charging current values, and information of change in voltage of the battery depending on temperature and charging current of the battery.

Referring to FIGS. 2 and 3, the method of predicting time for charging a battery of an eco-friendly vehicle will now be described in detail.

FIG. 2 is a flow chart showing procedures in a method of predicting time for charging a battery of an eco-friendly vehicle according to embodiments of the present disclosure, while FIG. 3 is a table showing charging conditions depending on temperature and voltage of a battery for each charging step.

As shown in FIG. 2, a method of predicting the charging time of a battery of an eco-friendly vehicle according to an embodiment of the present disclosure may comprise: measuring a temperature and a voltage of the battery using one or more sensors; comparing the measured temperature and voltage with data values pre-stored in a database including information relating to the plurality of charging steps; identifying a charging step among the plurality of charging steps based on the comparison of the measured temperature and voltage with the pre-stored data values; calculating a charging current value and a cutoff voltage value according to the identified charging step; calculating a first time required for the current voltage value of the battery to reach the cutoff voltage value; calculating a second time required for raising the measured temperature by a unit temperature predetermined based on the charging current value; comparing the first time with the second time; and calculating an expected charging time by adding the second time to the expected charging time when the first time is greater than the second time or by adding the first time to the expected charging time when the second time is greater than the first time.

According to embodiments of the present disclosure, the battery may be charged by a step-by-step charging process that includes a plurality of charging steps sequentially divided based on a voltage of the battery for each temperature. A charging current can correspond to each of the plurality of charging steps.

Specifically, in the method of predicting time for charging a battery of an eco-friendly vehicle according to the present disclosure, measuring temperature and voltage of the battery is firstly performed using one or more sensors, comparing the measured values with data values pre-stored in a database is subsequently performed, and then determining to which charging step the present condition corresponds is performed. For example, referring to FIG. 3, when the measured temperature of the battery is 21 degrees centigrade and the measured voltage of the battery is less than A, the current charging step may be determined as a first charging step. If the measured temperature of the battery is 21 degrees centigrade and the measured voltage of the battery is greater than B and less than C, the current charging step may be determined as a third charging step.

Further, after determining the charging step, a charging current value and a cutoff voltage value of the corresponding charging step may be calculated based on temperature and voltage of the battery derived in the procedure of determining to which charging step the present condition corresponds, information of the charging steps and the data values pre-stored in the database. For example, if the current charging step is determined as a first charging step because the measured temperature of the battery is 21 degrees centigrade and the measured voltage of the battery is less than A, a charging current a and a cutoff voltage A in the corresponding charging step may be calculated. If the current charging step is determined as a third charging step because the measured temperature of the battery is 21 degrees centigrade and the measured voltage of the battery is greater than B and less than C, a charging current c and a cutoff voltage C in the corresponding charging step may be calculated.

On the other hand, in the procedure of calculating a charging current value and a cutoff voltage value, the charging current value may be calculated by comparing the maximum current value of a charger with the charging current value calculated based on temperature and voltage of the battery, information of the charging steps and the data values pre-stored in the database. More specifically, if the charging current value calculated based on temperature and voltage of the battery, information of the charging steps and the data values pre-stored in the database is greater than the maximum current that the charger can supply, the maximum current that the charger can supply can be set as the charging current.

In the next procedure, the first time required for the current voltage value of the battery to reach the cutoff voltage value may be calculated in the procedure of calculating a charging current value and a cutoff voltage value. For example, if the measured temperature of the battery is 21 degrees centigrade and the measured voltage of the battery is less than A, the first time may be the time required for the measured voltage of the battery to reach the cutoff voltage A of the first charging step.

On the other hand, in the procedure of calculating a first time, the first time required for reaching the cutoff voltage value may be calculated according to Equation 1, shown below, based on the charging amount calculated based on the current voltage of the battery and information of the estimated charging amount calculated based on the cutoff voltage value calculated in the procedure of calculating a charging current and a cutoff voltage.

$$\text{first time} = \frac{\text{reference } cacity \text{ for calculating } SOC\,(mAh)}{1000} \times \frac{\text{estimated charging amount} - \text{current charging amount}}{1000} \times \frac{3600 \times 10}{\text{charging current}} \quad [\text{Equation 1}]$$

In other words, the current charging amount calculated based on the measured voltage of the battery, information of the estimated charging amount calculated based on the cutoff voltage A in the first charging step and information of the charging current in the first charging step may be substituted into Equation 1 above to calculate the first time.

In the next procedure, a second time required for raising temperature by a unit temperature predetermined based on the charging current value calculated in the procedure of calculating a charging current value and a cutoff voltage value. For example, if the temperature of the battery is 21 degrees centigrade and corresponds to that in the first charging step and the predetermined unit temperature is 1 degree centigrade, the second time may be the time required for raising the temperature of the battery by 1 degree centigrade when the charging current in an amount of a is supplied.

In the next procedure, the first time may be compared with the second time and then an expected charging time may be calculated by adding the second time to the expected charging time when the first time is greater than the second time whereas adding the first time to the expected charging time when the second time is greater than the first time.

In the next procedure after adding the second time to the expected charging time, the current temperature of the battery may be updated and a charging amount calculated on the basis of the current voltage of the battery may be updated. At this time, the charging amount can be updated according to Equation 2, as follows:

$$\text{current charging amount} = \text{current charging amount} + \frac{\frac{\text{second time} \times \text{charging current}}{3600} \times 1000 \times 1000}{\text{reference } cacity \text{ of } SOC\,(mAh)} \quad [\text{Equation 2}]$$

In this case, the reason for updating temperature of the battery is that the temperature of the battery rises by a predetermined unit temperature as the charging current is supplied for the second time. For example, when the predetermined unit temperature is 1 degree centigrade, the temperature of the battery may be updated by raising 1 degree centigrade from the current temperature after adding the second time to the expected charging time. Further, the reason for updating the current charging amount is that the charging current is supplied for the second time and voltage rises as the charging current is supplied and, as a result, the charging amount can be increased.

In addition, in the next procedure after adding the first time to the expected charging time, the current charging step may be updated to the next charging step. In other words, for example, if the current charging step is the first charging step, it can be updated to the second charging step.

On the other hand, according to embodiments of the present disclosure, the procedure of calculating a charging current and a cutoff voltage, the procedure of calculating a first time, the procedure of calculating a second time, the procedure of calculating an expected charging time, the procedure of updating temperature, the procedure of updating a charging amount and the procedure of updating charging steps may be repeatedly performed until the current charging step reaches the predetermined charging step or the current charging amount of the battery reaches the target charging amount, as shown in FIG. 2. Here, the predetermined charging step may be the last charging step among a plurality of charging steps divided sequentially. In other words, referring to FIG. 3, the predetermined charging step may be the seventh charging step.

Therefore, in the procedure of calculating a charging current value and a cutoff voltage value after the procedure of calculating an expected charging time, a charging current value and a cutoff voltage of a corresponding charging step may be calculated based on, temperature of the battery and information of a charging amount, which are updated in the procedures of updating temperature and updating a charging amount, and the data values pre-stored in the database, or alternatively, information of charging steps updated through the procedure of updating charging steps and the data values pre-stored in the database.

For example, referring to FIG. 3, if the temperature of the battery is 21 degrees centigrade and corresponds to that of the first charging step and the charging step is updated to the second charging step through the procedure of updating charging steps after the procedure of calculating an expected charging time, the charging current b and the cutoff voltage B can be calculated through the procedure of calculating a charging current and a cutoff voltage. In the same manner as the above, a charging current value and a cutoff voltage value may be calculated based on the updated information of temperature and a charging amount and information as shown in FIG. 3 which is pre-stored in the database.

On the other hand, according to embodiments of the present disclosure, the method may further comprise determining whether the current charging step has reached a predetermined charging step or determining whether the current charging amount has reached a target charging amount after adding the first time to the expected charging time. In this case, in the procedure of determining whether the current charging step has reached a predetermined charging step, if it is determined that the present charging step has reached the predetermined charging step, calculation of the expected total charging time may be terminated. Further, in the procedure of determining whether the current charging amount has reached a target charging amount, if it is determined that the current charging amount has reached the target charging amount, calculation of the expected total charging time may be terminated.

As discussed above, referring to FIG. 2, the expected total charging time may be calculated by repeatedly performing the procedure of calculating a charging current and a cutoff voltage, the procedure of calculating a first time, the procedure of calculating a second time, the procedure of calculating an expected charging time, the procedure of updating temperature, the procedure of updating a charging amount and the procedure of updating charging steps until the current charging step reaches the predetermined charging step or the current charging amount of the battery reaches the target charging amount wherein if the present charging step has reached the predetermined charging step or the current charging amount has reached the target charging amount, calculation of the expected total charging time may be terminated.

In other words, the expected total charging time of the battery may be a total of the expected charging time calculated by accumulating the expected charging time through the procedure of calculating an expected charging time, which is repeatedly performed until the current charging step reaches the predetermined charging step or the current charging amount reaches the target charging amount.

More specifically, referring to FIG. 3, if conditions at the time of initiating charge correspond to those in the first charging step, the expected total charging time may be a total of the expected charging time calculated by accumulating the expected charging time through the procedure of calculating an expected charging time during repeatedly performing the procedure of calculating a charging current and a cutoff voltage, the procedure of calculating a first time, the procedure of calculating a second time, the procedure of calculating an expected charging time, the procedure of updating temperature, the procedure of updating a charging amount and the procedure of updating charging steps until the first charging step reaches the seventh charging step.

As discussed above, according to the present disclosure, a more accurate expected time for charging a battery can be calculated, thereby enhancing user convenience during a process of charging the battery.

Although the present disclosure has been described and illustrated with respect to certain embodiments, it will be apparent by those who have ordinary skill in the art that various modifications and changes to the present disclosure may be made without departing from the spirit and scope of the present disclosure as defined in the appended patent claims.

What is claimed is:

1. A method of predicting time for charging a battery of an eco-friendly vehicle, in which the battery is charged by a charging process including plurality of charging steps sequentially divided based on a voltage of the battery for each temperature, wherein a charging current corresponds to each of the plurality of charging steps, the method comprising:
    measuring a temperature and a voltage of the battery using one or more sensors;
    comparing the measured temperature and voltage with data values pre-stored in a database including information relating to the plurality of charging steps;
    identifying a charging step among the plurality of charging steps based on the comparison of the measured temperature and voltage with the pre-stored data values;
    calculating a charging current value and a cutoff voltage value according to the identified charging step;
    calculating a first time required for the current voltage value of the battery to reach the cutoff voltage value;
    calculating a second time required for raising the measured temperature by a unit temperature predetermined based on the charging current value;
    comparing the first time with the second time; and
    calculating an expected charging time by adding the second time to a previous expected charging time when the first time is greater than the second time or by adding the first time to the previous expected charging time when the second time is greater than the first time.

2. The method of claim 1, further comprising, after calculating the expected charging time by adding the second time to the previous expected charging time, updating the measured temperature of the battery and a charging amount based on the measured voltage of the battery.

3. The method of claim 1, further comprising updating the charging process from the current charging step to a next charging step after calculating the expected charging time by adding the first time to the expected charging time.

4. The method of claim 2, wherein the calculating of the charging current value and the cutoff voltage value comprises calculating the charging current value and the cutoff voltage of a corresponding charging step based on the updated temperature of the battery, the updated charging amount, and the data values pre-stored in the database.

5. The method of claim 3, wherein the calculating of the charging current value and the cutoff voltage value comprises calculating the charging current value and the cutoff voltage of a corresponding charging step based on then updated charging process and the data values pre-stored in the database.

6. The method of claim 1, wherein the calculating of the first time comprises calculating the first time based on a charging amount calculated based on the measured voltage of the battery and the expected charging time.

7. The method of claim 1, further comprising determining whether the current charging step has reached a predetermined charging step after calculating the expected charging time by adding the first time to the expected charging time.

8. The method of claim 1, further comprising determining whether a current charging amount has reached a target charging amount after calculating the expected charging time by adding the first time to the expected charging time.

9. The method of claim 7, further comprising, when it is determined that the current charging step has reached the predetermined charging step, terminating the calculation of the expected charging time.

10. The method of claim 8, further comprising, when it is determined that the current charging amount has reached the target charging amount, terminating the calculation of the expected charging time.

11. The method of claim 1, wherein the calculating of the charging current value and the cutoff voltage value comprises calculating the charging current value by comparing the maximum current value of a charger with the charging current value.

* * * * *